(12) United States Patent  
Lee

(10) Patent No.: US 8,779,597 B2  
(45) Date of Patent: Jul. 15, 2014

(54) SEMICONDUCTOR DEVICE WITH BASE SUPPORT STRUCTURE

(76) Inventor: Sang-Yun Lee, Beaverton, OR (US)

(*) Notice: Subject to any disclaimer, the term of this patent is extended or adjusted under 35 U.S.C. 154(b) by 0 days.

(21) Appl. No.: 11/180,286

(22) Filed: Jul. 12, 2005

(65) Prior Publication Data

US 2005/0280156 A1 Dec. 22, 2005

Related U.S. Application Data

(63) Continuation-in-part of application No. 10/873,969, filed on Jun. 21, 2004, now Pat. No. 7,052,941.

(51) Int. Cl.
*H01L 23/535* (2006.01)

(52) U.S. Cl.
USPC .......... 257/773; 257/750; 257/E23.145; 257/E23.151; 257/E23.168

(58) Field of Classification Search
USPC ........... 257/296, 774, 750, 773, E29.113, 257/E23.011, E23.145, E23.151, E23.168; 365/72
See application file for complete search history.

(56) References Cited

U.S. PATENT DOCUMENTS

| | | | |
|---|---|---|---|
| 5,091,762 A * | 2/1992 | Watanabe | 257/71 |
| 5,266,511 A * | 11/1993 | Takao | 438/401 |
| 5,835,396 A * | 11/1998 | Zhang | 365/51 |
| 6,545,297 B1 * | 4/2003 | Noble et al. | 257/124 |
| 6,624,033 B2 * | 9/2003 | Noble | 438/300 |
| 6,677,204 B2 * | 1/2004 | Cleeves et al. | 438/268 |
| 6,881,994 B2 * | 4/2005 | Lee et al. | 257/296 |
| 6,943,407 B2 * | 9/2005 | Ouyang et al. | 257/329 |
| 2002/0141233 A1 * | 10/2002 | Hosotani et al. | 365/158 |
| 2003/0029920 A1 * | 2/2003 | Chhor et al. | 235/492 |
| 2003/0067043 A1 * | 4/2003 | Zhang | 257/390 |
| 2003/0139011 A1 * | 7/2003 | Cleeves et al. | 438/257 |
| 2004/0155301 A1 * | 8/2004 | Zhang | 257/390 |
| 2004/0160849 A1 * | 8/2004 | Rinerson et al. | 365/230.06 |
| 2004/0262635 A1 * | 12/2004 | Lee | 257/199 |

* cited by examiner

*Primary Examiner* — Steven Loke
*Assistant Examiner* — Earl Taylor
(74) *Attorney, Agent, or Firm* — Greg L Martinez

(57) ABSTRACT

An apparatus includes a semiconductor chip with a base support structure having a surface and an opposed surface. At least one device structure extends from the surface of the base support structure. A first conductive region is coupled to the base support structure. At least a portion of the first conductive region extends below the opposed surface.

107 Claims, 11 Drawing Sheets

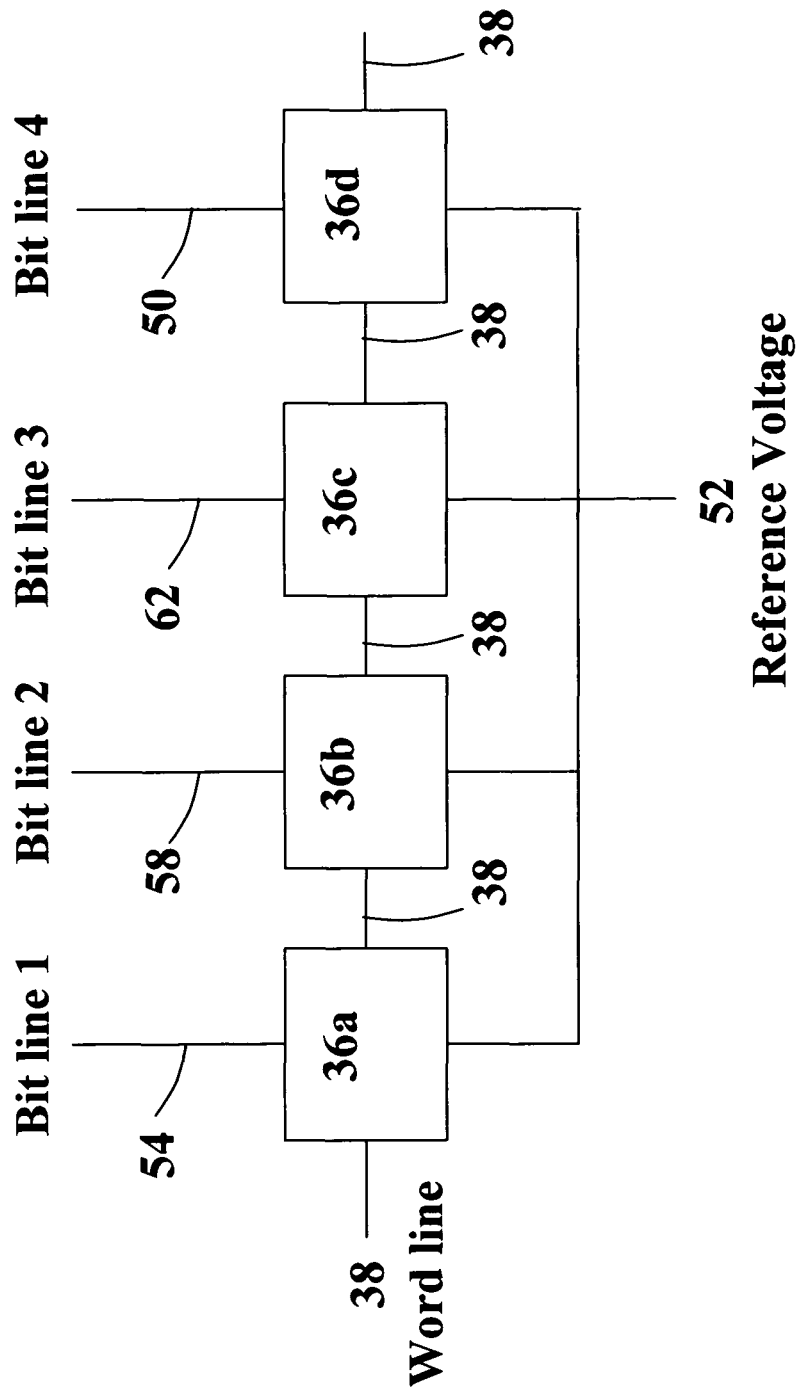

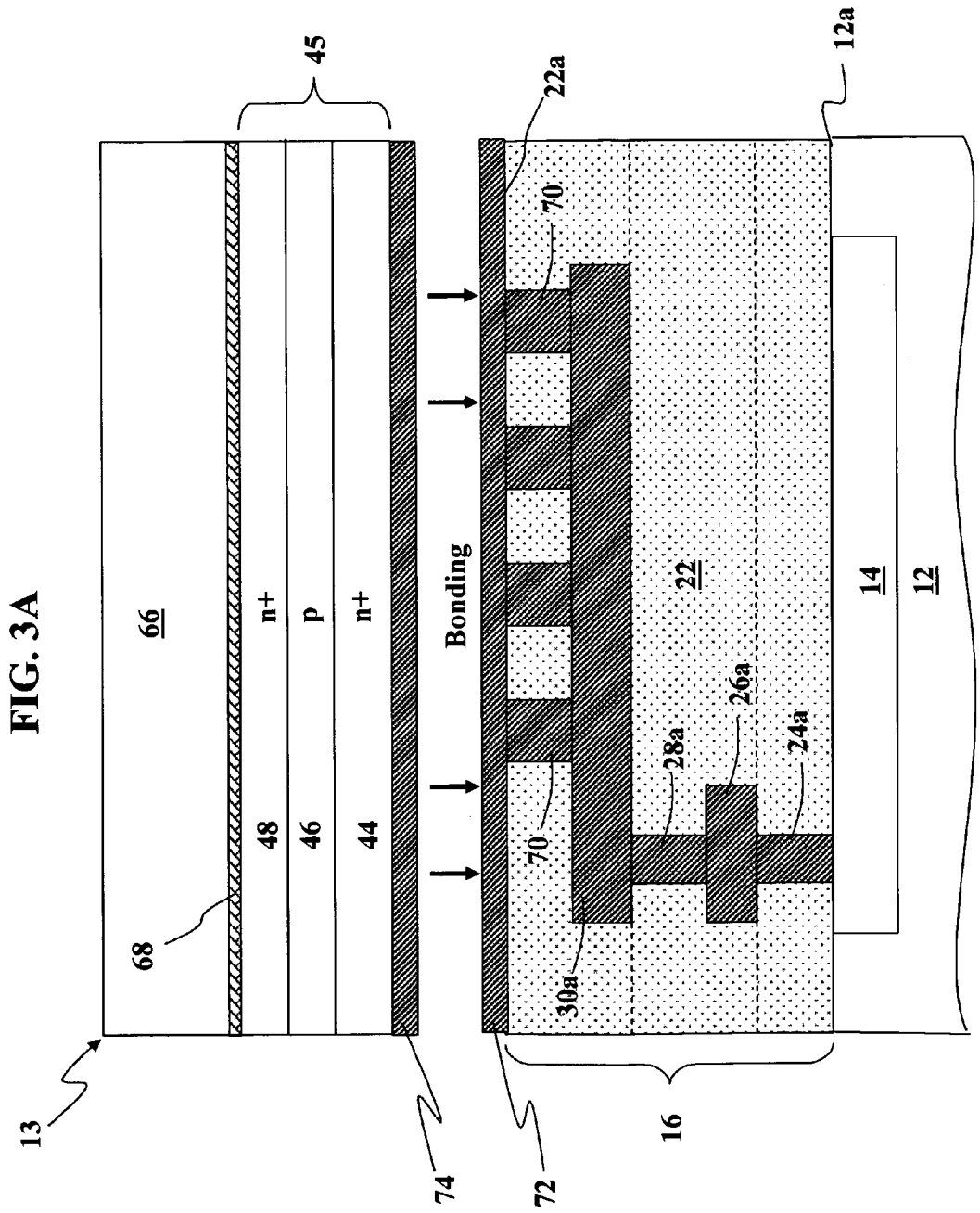

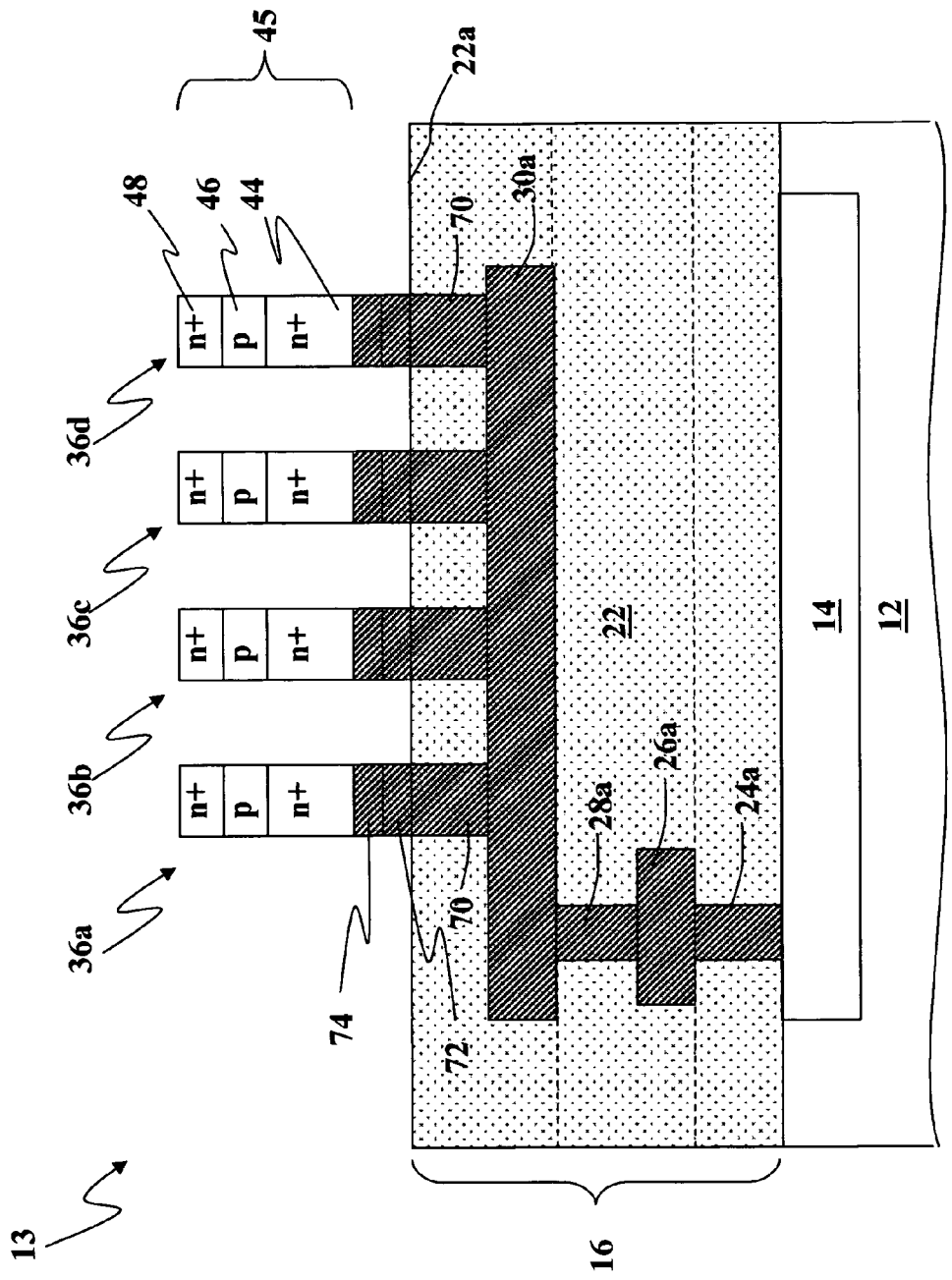

SEMICONDUCTOR DEVICE WITH BASE SUPPORT STRUCTURE

CROSS REFERENCE TO RELATED APPLICATIONS

This is a continuation-in-part of application Ser. No. 10/873,969, entitled "THREE-DIMENSIONAL INTEGRATED CIRCUIT STRUCTURE AND METHOD OF MAKING SAME", which was filed 21 Jun. 2004 now U.S. Pat. No. 7,052,941 and is incorporated in its entirety herein by reference.

BACKGROUND OF THE INVENTION

1. Field of the Invention

This invention relates generally to semiconductor circuitry and, more particularly, to three dimensional vertical semiconductor devices.

2. Description of the Related Art

Advances in semiconductor manufacturing and digital systems architecture have provided chips or integrated circuits with many millions of active and passive circuit components, along with the interconnects needed to create the desired circuit networks. Active devices typically include transistors and passive devices typically include resistors, capacitors, and inductors. As is well-known, most integrated circuits include transistors that are primarily implemented on a single major surface of a substrate, such as a semiconductor wafer. These laterally oriented devices consume significant amounts of chip area. Over a number of years, manufacturing advances related to transistors and interconnects have primarily been directed to reducing the lateral dimensions thereof so that more devices per unit area can be placed on a chip. However, the equipment and technologies required to fabricate such highly integrated chips becomes increasingly expensive with each new generation of smaller devices. Accordingly, what is needed are structures and methods that are suitable for providing increased circuit density in integrated circuits without necessarily requiring devices to be made smaller.

BRIEF SUMMARY OF THE INVENTION

The present invention provides a semiconductor chip with a base support structure having a surface and an opposed surface. At least one device structure extends from the surface of the base support structure. A first conductive region is coupled to the base support structure. At least a portion of the first conductive region extends below the opposed surface.

The present invention also provides a semiconductor chip with an interconnect region. A base support structure is carried by the interconnect region. A plurality of device structures extend upwardly from a surface of the base support structure. A first conductive region is coupled to the base support structure. At least a portion of the first conductive region extends below an opposed surface of the base support structure. A second conductive region is coupled to at least one device structure. At least a portion of the second conductive region extends below the opposed surface of the base support structure.

The present invention further provides a semiconductor chip with an acceptor substrate which carries electronic circuitry. An interconnect region is carried by the acceptor substrate. A base support structure is carried by the interconnect region. One or more device structure(s) are carried by the base support structure. A first conductive region is coupled between the base support structure and the electronic circuitry. A second conductive region is coupled between a corresponding device structure and the electronic circuitry.

These and other features, aspects, and advantages of the present invention will become better understood with reference to the following drawings, description, and claims.

BRIEF DESCRIPTION OF THE DRAWINGS

FIG. 2 is a simplified schematic diagram of the circuit of FIG. 1A; and

FIGS. 3A-3E are simplified sectional views of steps in the fabrication of a circuit without a base support structure.

DETAILED DESCRIPTION OF THE INVENTION

Figure 1A:
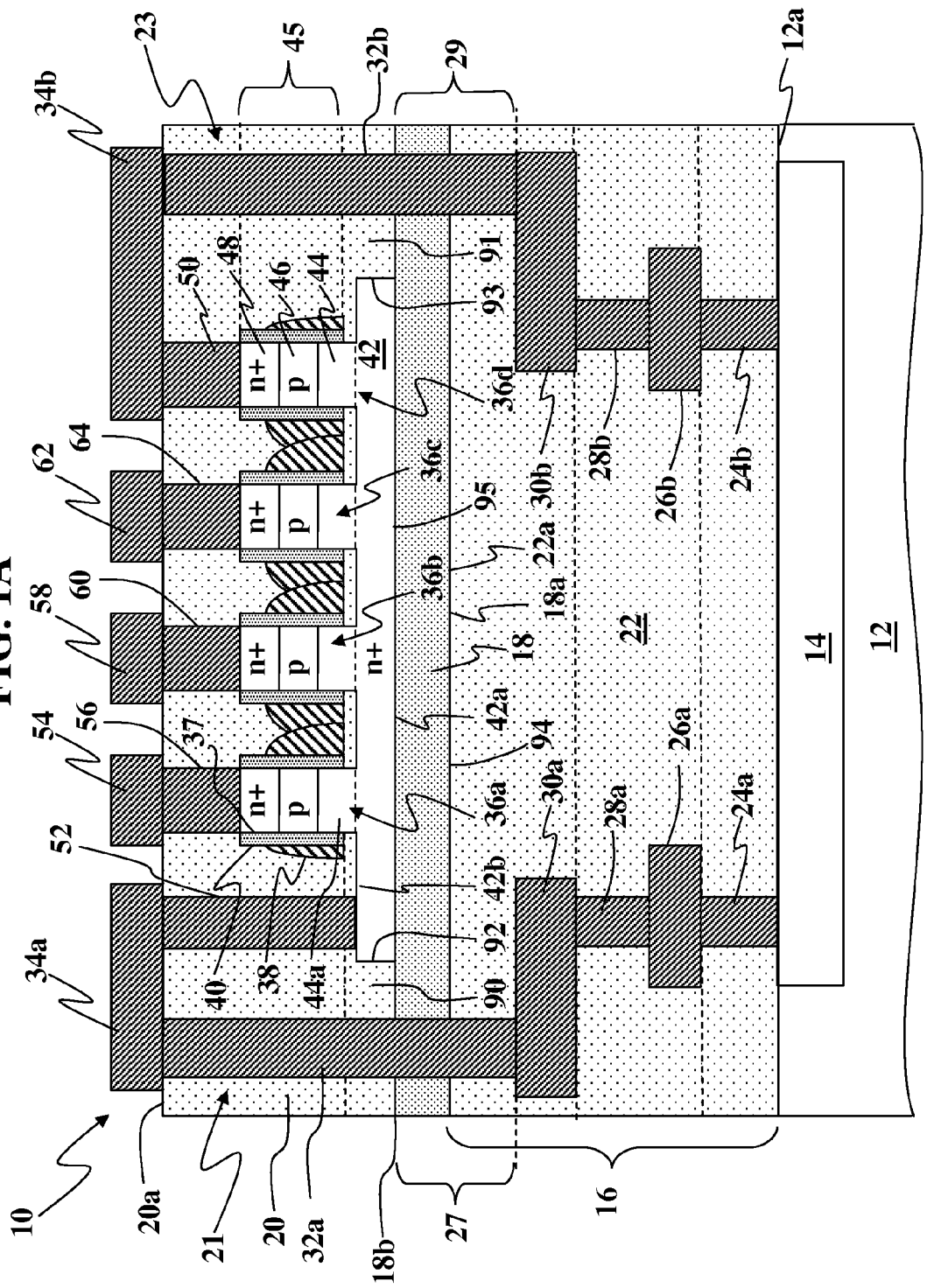
FIGS. 1A-1E are a simplified sectional views of a various embodiments of a circuit with a base support structure in accordance with the present invention.

FIG. 1A is a simplified sectional view of a circuit 10 in accordance with the present invention. It should be noted that in the following figures, like reference characters indicate corresponding elements throughout the several views. Circuit 10 can be included in a number of different circuits. For example, it can be included in a processor chip or stand-alone memory. In this embodiment, circuit 10 includes electronic devices positioned above a microprocessor and/or control circuitry. As discussed in more detail below, the electronic devices are coupled to the microprocessor and/or control circuitry through conductive vias and/or interconnects.

In this embodiment, circuit 10 includes a substrate 12 which carries an electronic circuit 14. In this example, electronic circuit 14 is positioned adjacent to a surface 12a of substrate 12, but in other examples, circuit 14 can extend above or below surface 12a. Substrate 12 includes silicon, but it can include many other different types of materials, such as silicon carbide, indium phosphide, gallium arsenide, or silicon oxide, among others. Electronic circuit 14 can include many different types of circuits and devices. In this example, circuit 14 is based on CMOS technology which is typically used in state-of-the art microprocessor and control circuits, but in other examples, circuit 14 can include other known circuitry, such as bipolar junction transistor based circuitry, among others.

The circuitry included in circuit 14 can be analog, digital, or combinations thereof. Analog circuitry is typically used for analog signal processing and digital circuitry is typically used for digital signal processing and computing applications. Combinations of analog and digital circuitry are typically used for analog-to-digital converter and digital-to-analog converters, among other applications. More information about substrate 12 and electronic circuit 14 can be found in U.S. Pat. No. 7,633,162, entitled "ELECTRONIC CIRCUIT WITH EMBEDDED MEMORY," which issued on Dec. 30, 2008 to the same inventor, the contents of which are incorporated by reference as though fully set forth herein.

In this embodiment, an interconnect region 16 is positioned on surface 12a. Interconnect region 16 provides support for structure positioned thereon its surface 22a and allows signals to flow therethrough. Interconnect region 16 includes a dielectric material region 22 through which conductive interconnects and/or vias extend. In this particular example, region 16 includes contacts 24a and 24b which are coupled to electronic circuit 14 on one end and interconnects 26a and 26b, respectively, on their other ends. Conductive vias 28a and 28b extend upwardly from interconnects 26a and 26b, respectively, from one end and connect to interconnects 30a and 30b, respectively, on their other ends. It should be noted that interconnect region 16 can include more or fewer vias and interconnects and that they can be connected together in many other different ways than those shown here.

The interconnects and vias included in interconnect region 16 can include many different conductive materials. In this example, the interconnects and vias include aluminum, but in other examples, they can include conductive materials such as gold, silver, titanium, titanium silicide, platinum, copper, or tungsten, tungsten silicide, tantalum, and doped polysilicon, among others. The choice of conductive material depends on many different parameters, such as the desired resistance of the via or interconnect, the operating frequency of circuit 10, and/or the fabrication cost. The choice can also depend on manufacturing parameters, such as the conductive material deposition temperature and/or the temperature of subsequent device process steps in the fabrication of device 10. For example, aluminum can be deposited at a much lower temperature than other conductive materials, such as gold and platinum. A lower deposition temperature may be desirable to reduce the temperature degradation of electronic circuit 14 and/or other portions of circuit 10.

A dielectric material region 18 is positioned on surface 22a. In accordance with the invention a surface 18a of dielectric region 18 is bonded to surface 22a of dielectric region 22. The bonding can be done in many different ways. More information about wafer bonding can be found in U.S. Pat. No. 7,470,142, entitled "WAFER BONDING METHOD," which issued on Dec. 30, 2008 to the same inventor, the contents of which are incorporated by reference as though fully set forth herein. Dielectric material regions 18 and 22 can include many different types of dielectric materials. In this example, regions 18 and 22 include silicon oxide. In other examples, they can include TEOS (Tetra-Ethyl-Ortho-Silicate), BPSG (BoroPhsphosilicate Glass), BSG (Boron Silicate Glass), aluminum nitride or silicon nitride, among others. Dielectric material regions 18 and 22 can be formed using many different methods, such as CVD (Chemical Vapor Deposition) and SOG (Spin On Glass). It should be noted that other low dielectric constant materials, such as SiCOH and Organosilicate Glass (OSG), Nano-Cluster Silica (NCS) films, could also be used for the dielectric regions.

In accordance with the invention, circuit 10 includes a base support structure 42 with a surface 42a positioned on a surface 18b of dielectric region 18. In this way, electronic circuit 14 is positioned below surface 42a of base support structure 42. In some embodiments, surface 42a is planarized so that base support structure 42 includes a planarized surface. More information regarding planarized surfaces can be found in U.S. patent application Ser. No. 11/092,500, as well as in U.S. Patent Nos. 7,052,941 and 7,470,598, which are referenced herein. A surface can be planarized in many different ways, such as by using chemical mechanical polishing (CMP). Base support structure 42 has one or more device structures extending upwardly therefrom a surface 42b. In this particular embodiment, four device structures 36a, 36b, 36c, and 36d extend upwardly from base support structure 42, although there can be fewer of more in other examples. Each device structure 36a-36d includes a material stack 45. Each stack 45 is surrounded by a dielectric region 40 and each dielectric region 40 is surrounded by a control terminal 38. In this embodiment, control terminals 38 are coupled to each adjacent control terminal, but they can be separate in other examples. It should be noted that in some examples each stack 45 does not have to be surrounded by dielectric region 40 and/or control terminal 38, but here they are for illustrative purposes. Whether a particular stack 45 is surrounded by dielectric region 40 and/or control terminal 38 depends on the desired operation of the device formed from stack 45.

In this embodiment, each device structure 36a-36d includes a stack of semiconductor layers which include an $n^+$-type doped layer 44 with a p-type doped layer 46 positioned on it. An $n^+$-type doped layer 48 is positioned on layer 46. In this embodiment, these layers can be doped using diffusion doping, during epitaxial growth, ion implantation, plasma doping, or combinations thereof. More information on the fabrication of device structures 36a-36d can be found in U.S. Pat. No. 7,470,598, entitled "SEMICONDUCTOR LAYER STRUCTURE AND METHOD OF MAKING THE SAME," which issued on Dec. 30, 2008 to the same inventor, the contents of which are incorporated by reference as though fully set forth herein.

In this embodiment, each device stack 36a-36d includes a sidewall 37 which extends perpendicular to surface 42b. However, in other examples, one or more of the sidewalls can be tapered relative to surface 42b. In this way, the dimension of bottom surface 14a of device structures 36a-36d are different from the dimension of its corresponding top surface 14b. The bottom surfaces of device structures 36a-36d are positioned adjacent to surface 42b and the top surfaces are positioned away from surface 42b. More information about device stacks with tapered sidewalls can be found in U.S. patent application Ser. No. 11/092,500, entitled SEMICONDUCTOR MEMORY DEVICE, filed on the same date herewith by the same inventor, the contents of which are incorporated by reference as though fully set forth herein. In one embodiment, each device stack 36a-36d is formed by etching through material stack 45 towards base support structure 42 so that surface 42b is an etched surface. In this way, sidewall 37 extends from an etched surface 42b. Each device stack 36a-36d is formed by etching through material stack 45 towards base support structure 42 to form a mesa structure. In some embodiments, etched surface 42b is opposed to planarized surface 42a. In this way, base support structure 42 includes a planarized surface opposed to an etched surface.

In one embodiment, device structure 36a, 36b, 36c, and 36d each include a portion of base support structure 42. In this way, circuit 10 includes a mesa structure which includes a portion of a base support structure. In FIG. 1A, base support structure 42 includes a protrusion 44a which extends away from surface 42a. In FIG. 1A, device structure 36a includes protrusion 44a. In some embodiments, protrusion 44a includes semiconductor material. In some embodiments, protrusion 44a includes single crystalline semiconductor material. In FIG. 1A, each device structure 36a, 36b, 36c and 36d includes a protrusion. In this way, base support structure 42 includes a plurality of protrusions which extend away from surface 42a.

A dielectric region 20 is positioned on surface 18b and 42b so that it surrounds base support structure 42 and device structures 36a-36d. A contact 52 is formed through dielectric region 20 so that it contacts base support structure 42. Contacts 56, 60, 64, and 50 are formed through dielectric region 20 so that they contact device structures 36a, 36b, 36c, and 36d, respectively. A via 32a is formed through dielectric regions 20 and 22 so that it contacts interconnect 30a. A via 32b is formed through dielectric regions 20 and 22 so that it connects interconnect 30b. The vias and interconnects discussed here can be made of the same of similar conductive materials as the vias and interconnects included in interconnect region 16.

A conductive region 21 includes contact 52, interconnect 34a, and via 32a. In accordance with the invention, a portion 27 of conductive region 21 extends below surface 42a of base support structure 42. A conductive region 23 includes contact 50, interconnect 34b, and via 32b. In accordance with the invention, a portion 29 of conductive region 23 extends below surface 42a of base support structure 42. Portions 27 and 29 extend through dielectric regions 18 and 22 and conductive regions 21 and 23 do not extend through base support structure 42. In particular, vias 32a and 32b do not extend through base support structure 42. Conductive region 21 is not in communication with base support structure 42 through device structure 36d. Further, conductive region 23 is not in communication with device structure 36d through base support structure 42. Base support structure 42 includes sidewalls 92 and 93 which extend between surfaces 42a and 42b. Insulator material 90 is positioned between first conductive region 21 and sidewall 92 of base support structure 42. Further, insulator material 91 is positioned between, second conductive region 23 and sidewall 93 of base support structure 42. It should be noted that insulator materials 90 and 91 are portions of dielectric region 20 and, as mentioned above, can include the same materials as dielectric regions 18 and 22. In some embodiments, dielectric material region 18 is bonded to surface 42a of base support structure 42 so that a bonding interface 95 is formed therebetween. In this way, base support structure 42 is coupled with interconnect region 16 through bonding interface 95. Device structures 36a-36d are formed after bonding interface 95 is formed. In some embodiments, interconnect region 16 is bonded to dielectric material region 18 so that a bonding interface 94 is formed therebetween. In this way, base support structure 42 is coupled with interconnect region 16 through bonding interface 94. Device structures 36a-36d are formed after bonding interface 94 is formed.

More information regarding bonding and growth interfaces can be found in the references cited herein. Information regarding bonding and growth interfaces can also be found in U.S. Pat. Nos. 5,152,857, 5,695,557, 5,980,633 and 6,534,382.

A bonding interface is an interface that is formed in response to bonding material layers together, as discussed in U.S. Pat. No. 7,470,142. In one example of forming a bonding interface, first and second material layers are formed as separate layers, and moved towards each other so that they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, such as metals. In a metal-to-dielectric bonding interface, one of the first and second material layers is a conductive material, and the other one is a dielectric material. In a metal-to-semiconductor bonding interface, one of the first and second material layers is a conductive material, and the other one is a semiconductor material.

A growth interface is an interface that is formed in response to growing a material layer on another material layer, as discussed in U.S. Pat. No. 7,052,941. In one example of forming a growth interface, a third material layer is formed, and a fourth material layer is grown on the third material layer so that the growth interface is formed in response. In this way, a growth interface is established. The fourth material layer can be grown on the third material layer in many different ways, such as by chemical vapor deposition and sputtering. Hence, when forming a growth interface, third and fourth material layers are not formed as separate layers, and moved to engage each other as in bonding.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interface the third and fourth materials are dielectric materials.

It should be noted that, in general, it is difficult to establish a metal-tosemiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal layer because metal layers tend to not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material, then the semiconductor material will also have a non-crystalline crystal structure. Thus, it is useful to bond crystalline semiconductor material to a metal layer to form a metal-to-semiconductor bonding interface.

In general, bonding and growth interfaces have different types and amounts of defects. For example, dislocations often extend from a growth interface in the direction of material growth. Hence, a bonding interface is not a growth interface, and a growth interface is not a bonding interface. The difference between bonding and growth interfaces can be determined in many different ways, such as by using Transmission Electron Microscopy (TEM) to determine the type and amount of defects proximate to the interface. Information regarding TEM can be found in U.S. Patent Nos. 5,892,225, 6,531,697, 6,822,233 and 7,002,152.

The conductivity of each material stack 45 is adjustable in response to a signal provided to its corresponding control terminal 38. In this way, control terminal 38 operates as a word line, conductive region 21 operates as a reference line, and conductive region 23 operates as a bit line. In this embodiment, each device structure 36a-36d operates as a metal oxide semiconductor field effect transistor (MOSFET) in which the conductivity of material stack 45 between conductive regions 21 and 23 is modulated in response to a signal applied to control terminal 38. Region 42 operates as a common electrical node between each adjacent device structure 36a-36d. It should be noted, however, that device structures 36a-36d can have many other layer structures so that they operate as a different type of device.

For example, device structures 36a-36d can be constructed so that they operate as a memory device, bipolar junction transistor, resistor, thyristor, capacitor, or image sensor, among others. The memory device can be a negative differential resistance static random access (NDR SRAM) device, a dynamic random access memory device (DRAM), non-volatile memory, or capacitorless DRAM, among others. For an NDR SRAM, device structures 36a-36d would include a thyristor and a MOSFET in material stack 45 and two different control terminals. One control terminal is coupled to the thyristor and the other one is coupled to the MOSFET. The two different control terminals are spaced from material stack 45 by corresponding insulator regions, similar to insulator region 40. More information about these device structures can be found in U.S. patent application Ser. No. 11/092,500, entitled SEMICONDUCTOR MEMORY DEVICE, filed on the same date herewith by the same inventor, the contents of which are incorporated by reference as though fully set forth herein.

Structure 42 and device structures 36a-36d can be fabricated in many different ways. For example, they can be fabricated as separate layer structures. In another example, they can be formed as a single integrated structure where the different regions are doped through ion implantation. The integrated structure can then be etched to form base support structure 42 and separate device structures 36a-36d. In this embodiment, it is preferred that base support structure 42 and device structures 36a-36d include single crystalline silicon material, but they can include other materials, such as silicon carbide, germanium, gallium arsenide, conductive materials, indium phosphide, etc. in other examples. Single crystalline silicon typically has localized crystalline defects, but it is generally of better material quality than amorphous or poly-silicon material. The conductive materials can be the same or similar to the conductive materials included in the conductive vias and interconnects discussed above.

Base support structure 42 provides many advantages. One advantage of structure 42 is that it provides a common electrical node for the device structures positioned on its surface 42b. In one embodiment, conductive region 21 operates as a current return which provides a reference potential. The reference potential can be AC and/or DC reference potentials. The common electrical node feature of structure 42 is illustrated in FIG. 2 which is a simplified schematic diagram of circuit 10. In FIG. 2, via 52 provides a common reference line through which the reference potential flows therethrough and is provided through base structure 42 to each device structure 36a-36d. Each control terminal 38 of structures 36a-36d are coupled together to provide a common word line and contacts 56, 60, 64, and 50 provide separate bit lines. The bit lines, word lines, and reference lines provide signals to control the operation of respective devices 36a-36d.

Another advantage of structure 42 is that it provides support for device structures 36a-36d so that they are less likely to topple over and/or become detached. One reason structure 42 does this is because device structures 36a-36d are more strongly bonded to structure 42 than they would be if they were directly and individually bonded to surface 18b. Another reason is that surface 42a has a larger surface area than the bottom surface of each device structure 36a-36d. Hence, surface 42a bonds more strongly to surface 18b because the bond strength depends on the surface area of the surfaces bonded together.

FIGS. 3A-3E show steps in a process flow for fabricating a circuit 13 which does not include base support structure 42 as described above to illustrate how device structures 36a-36d can topple over and/or become detached. In this example, substrate 12 carries circuit 14 as described above. Dielectric region 16 includes contact 24a, interconnect 26a, via 28a, contact 24b, and interconnect 26b as described above. In this example, however, an interconnect 30a is coupled to via 28a opposed interconnect 26a. Vias 70 extend upwardly from interconnect 30a from one end and extend to surface 22a. A conductive region 72 is positioned on surface 22a so that it is coupled to ends of each via 70 opposite interconnect 30a.

A donor substrate 66 is provided. Substrate 66 carries material stack 45 separated from substrate 66 by a detach region 68. A conductive region 74 is positioned on material stack 45. In this example, detach region 68 is formed by implanting a portion of substrate 66 with an implant species, which is preferably hydrogen. Regions 72 and 74 are bonded together. More information about forming detach region 68 and wafer bonding can be found in U.S. Patent No. 7,470,598, entitled "SEMICONDUCTOR LAYER STRUCTURE AND METHOD OF MAKING THE SAME," which issued on Dec. 30, 2008 to the same inventor, the contents of which are incorporated by reference as though fully set forth herein.

Figure 3B:
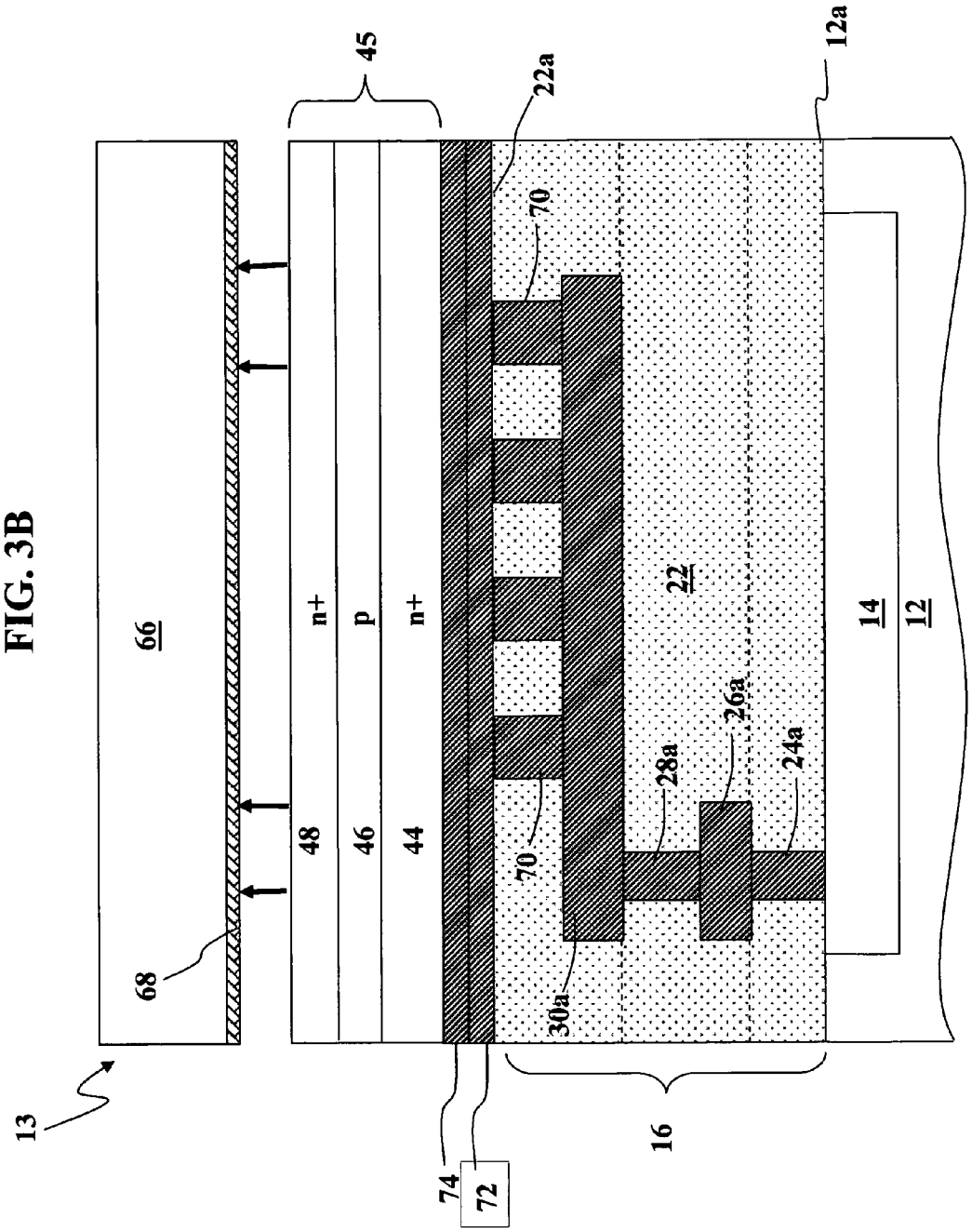
Figure 3D:
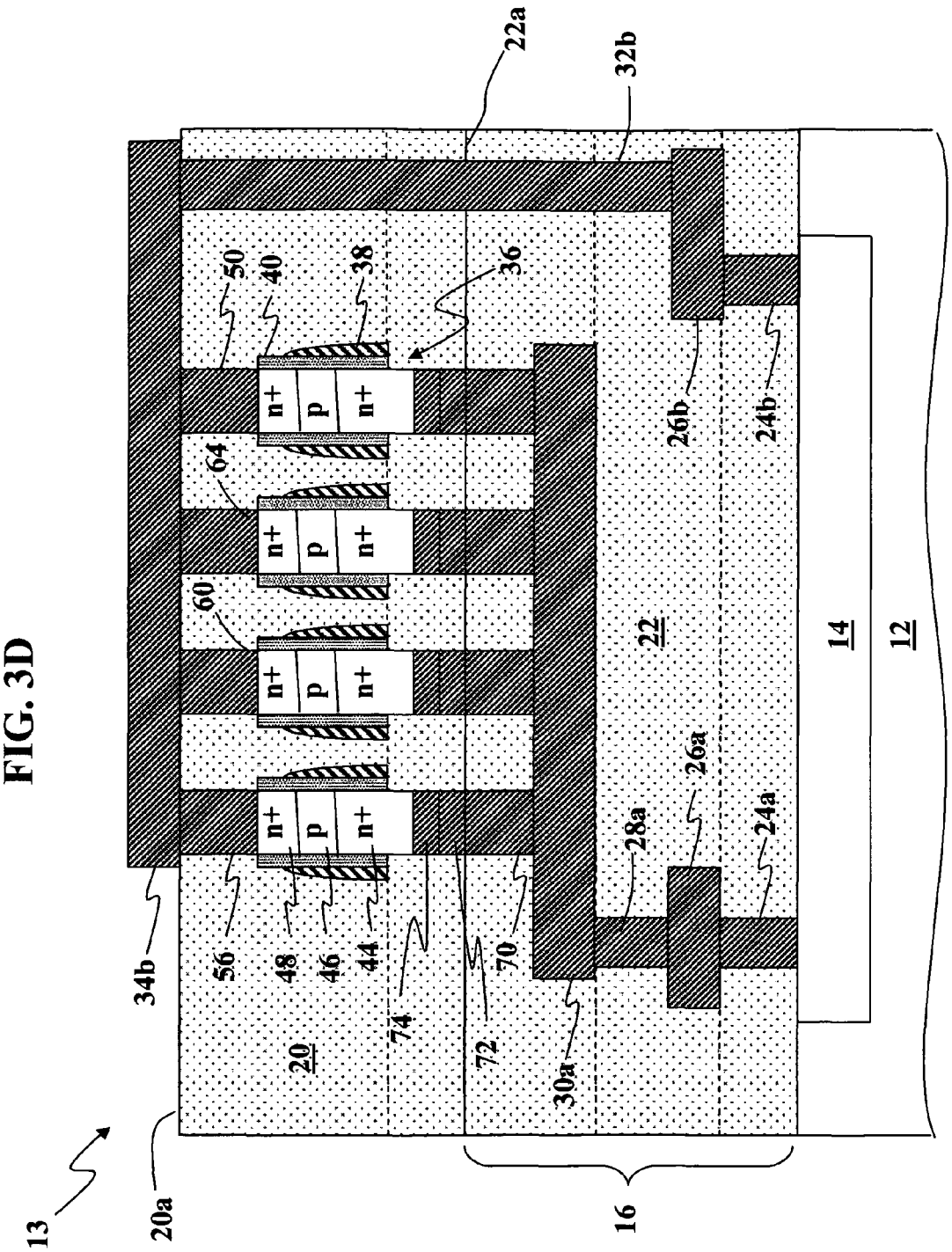

In FIG. 3B, detach region is formed by hydrogen doping, but in other examples, it can be formed as an ionized porous layer or a dielectric layer. In the case of hydrogen doping, the temperature of detach region 68 is increased to a level so that detach region 68 cleaves and substrate 66 separates from material stack 45. It should be noted that in some instances, portions of detach region 68 can be on region 48 and other portions can be on substrate 66. In these instances, the exposed surface of region 48 can be chemical mechanically polished to remove portions of detach region 68 thereon and to provide a flatter surface. As shown in FIG. 3C, material stack 45 is etched through to form device structures 36a-36d. As shown in FIG. 3D, dielectric region 20 is then positioned around device structures 36a-36d and conductive contacts 56, 60, 64, and 50 are formed through region 20 to provide separate contacts with corresponding device structures 36a-36d. A via 32b is formed through region 20 and into region 22 so that it contacts interconnect 26b. A conductive contact 34b is positioned on surface 20a of region 20 so that it is coupled to contacts 56, 60, 64, 50, and 32b.

Figure 3E:
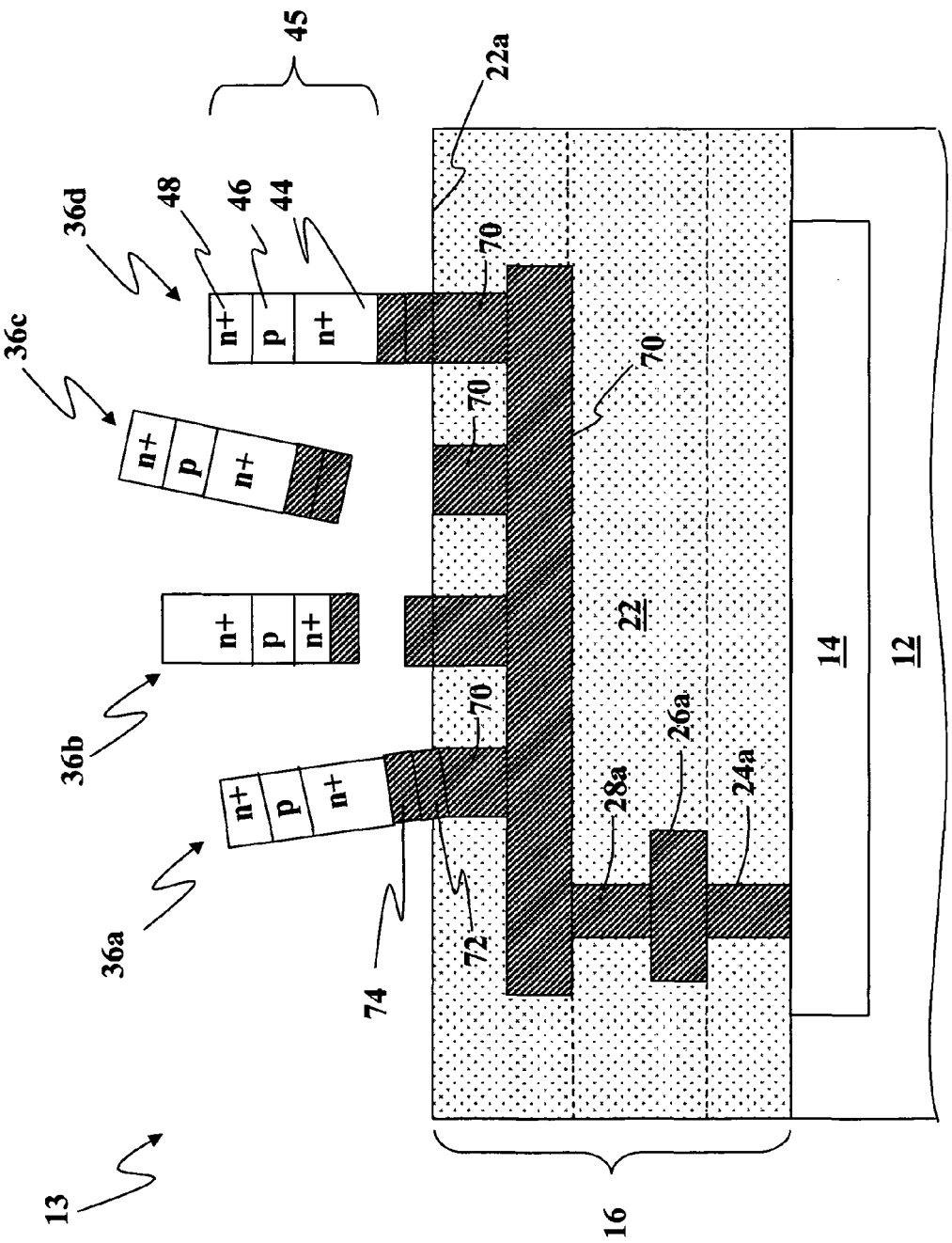

In some instances, as shown in FIG. 3E, device structures 36a-36d can undesirably topple over like device structure 36a. In some instances, conductive regions 72 and 74 can also undesirably detach from one another like device structure 36b. Further, in some instances, conductive region 72 can detach from via 70 like device structure 36b. These problems can decrease the yield and, consequently, increases the cost of fabricating circuit 10. These problems can also decrease the reliability of circuit 10 because, for example, device 36a can work for an undetermined period of time and then unexpectedly fail. In other examples, device 36a can work intermittently which can cause errors when reading, writing, and erasing information stored by it.

Figure 1B:
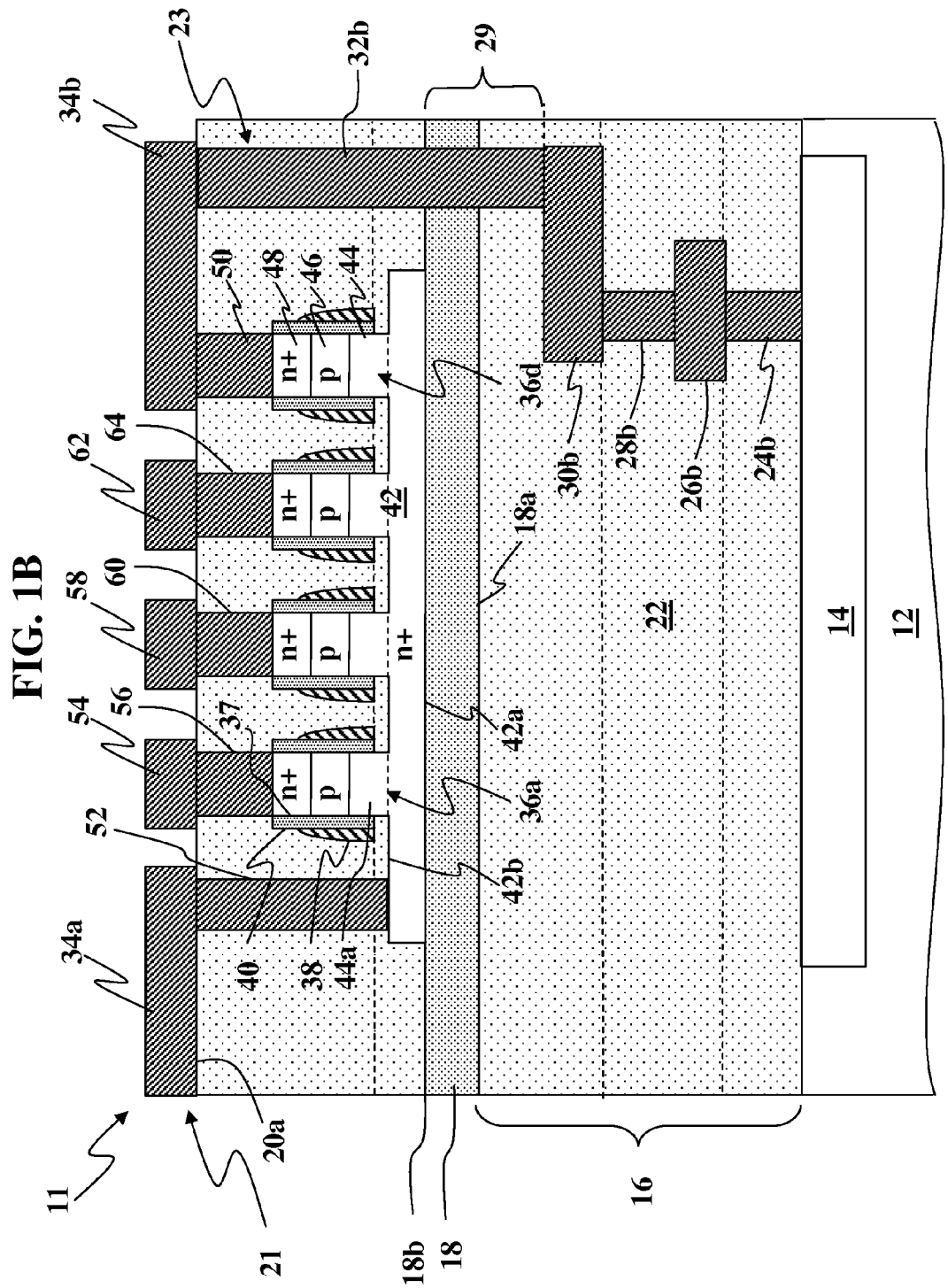

FIG. 1B is a simplified sectional view of a circuit 11 in accordance with the present invention, which is similar to circuit 10 discussed above. In this embodiment, however, conductive region 21 includes contact 52 and interconnect 34a. Interconnect 34a is positioned on surface 20a and can be coupled to an external reference line (not shown) which provides the reference potential. In accordance with the invention, portion 29 of conductive region 23 is below surface 42a which conductive region 21 is above surface 42a. Further, conductive region 23 does not extend through base support structure 42, In particular, via 32b does not extend through base support structure 42.

Figure 1C:
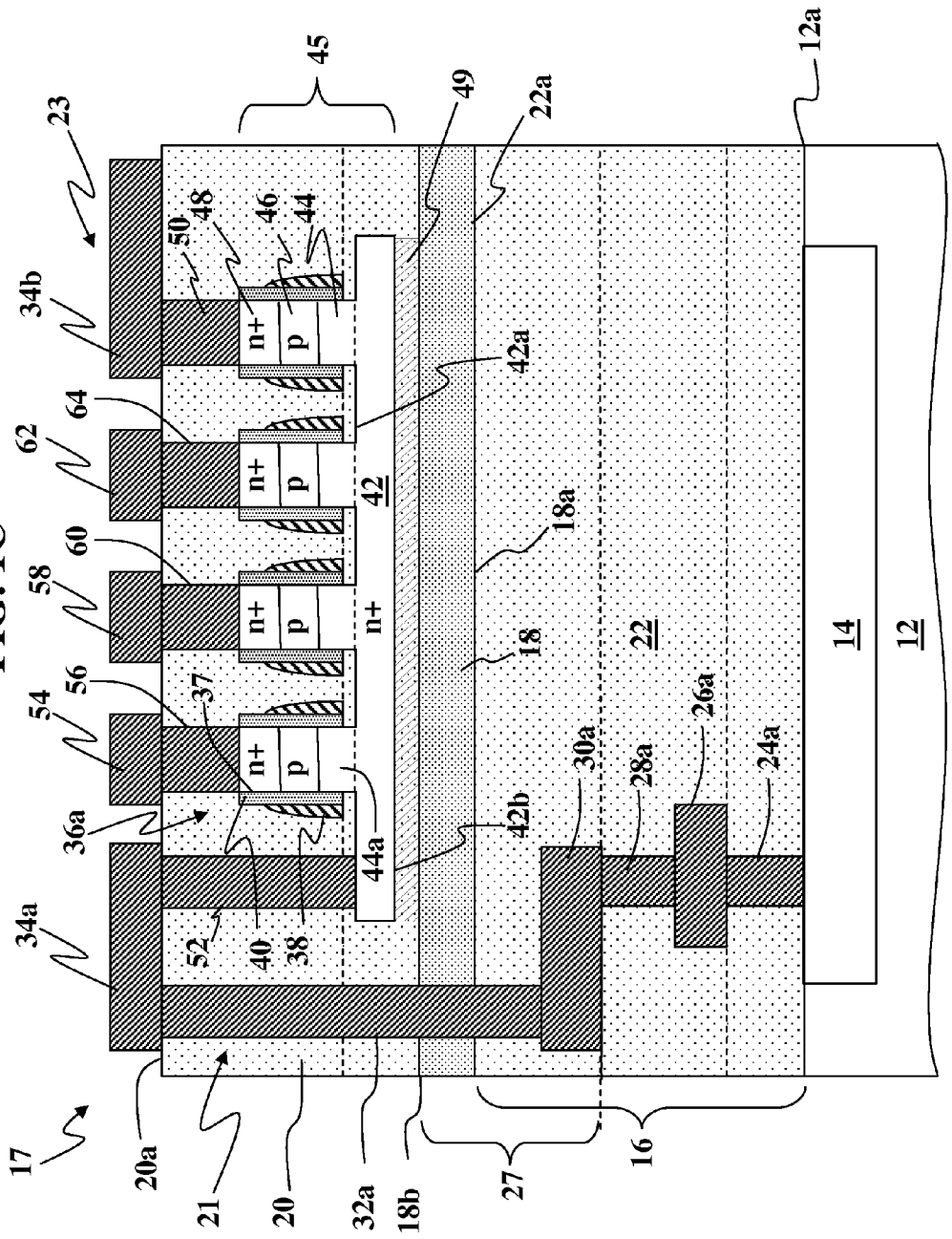

FIG. 1C is a simplified sectional view of a circuit 17 in accordance with the present invention, which is similar to circuit 10 discussed above. In this embodiment, however, conductive region 23 includes via 50 and conductive interconnect 34b. Interconnect 34b is positioned on surface 20a and can be coupled to an external bit line (not shown). The external bit line can flow signals to and from circuit 14 or another circuit. In accordance with the invention, portion 27 of conductive region 21 is below surface 42a while conductive region 23 is above surface 42a. Further, conductive region 21 does not extend through base support structure 42. In particular, via 32a does not extend through base support structure 42. Also, in this embodiment, a conductive material region 49 is positioned between dielectric region 18 and base support structure 42. Here, the bonding surface is between surfaces 18a and 22a. Region 49 provides a lower resistance signal path for signals flowing between contact 52 and device structures 36a-36d. The conductive material included in region 49 can be the same or similar to the materials included in the various vias and interconnects in circuit 10.

Figure 1D:
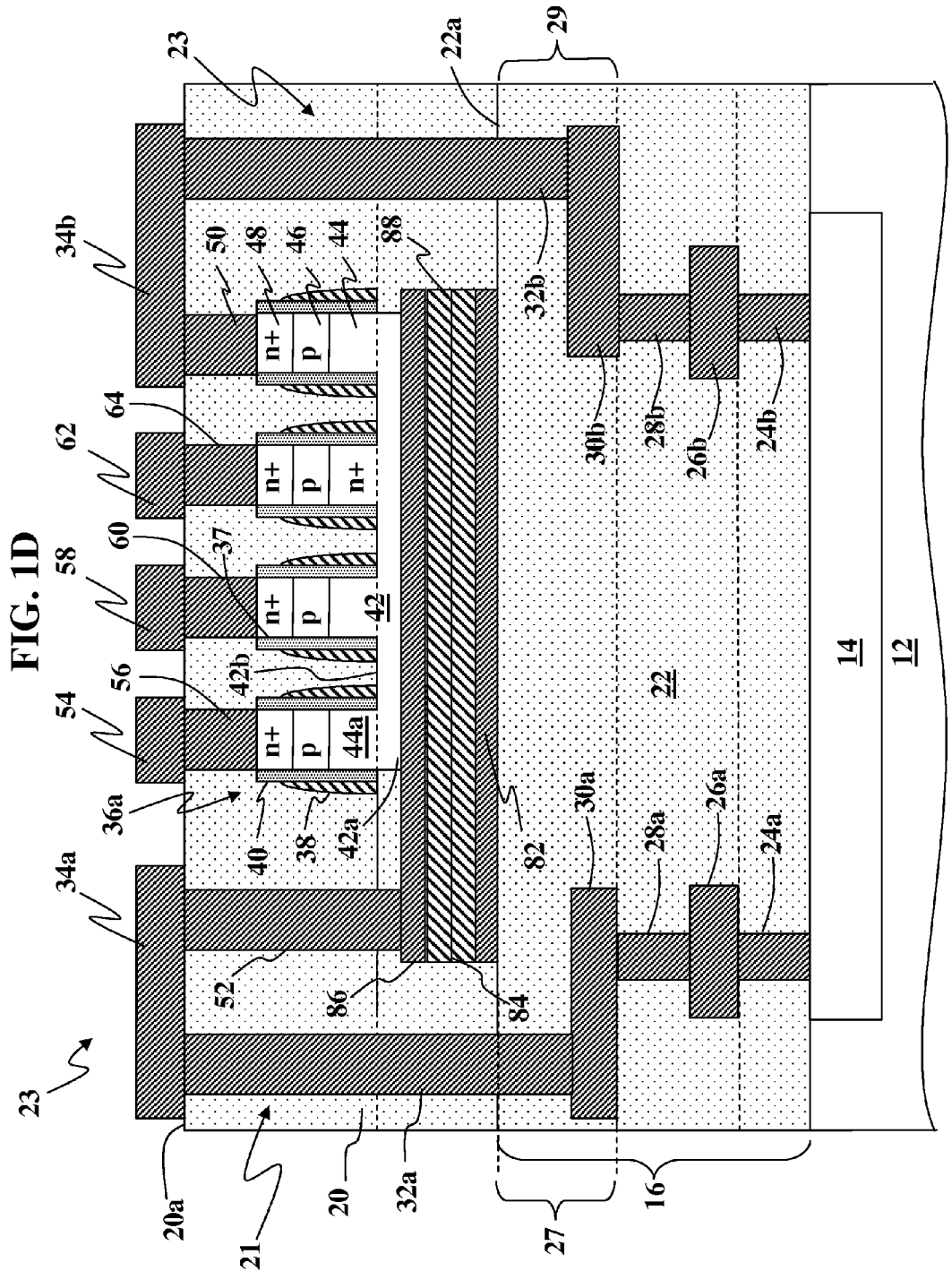

FIG. 1D is a simplified sectional view of a circuit 23 in accordance with the present invention, which is similar to circuit 10 discussed above. In this embodiment, however, a conductive material region 82 is positioned on surface 22a and a conductive material region 84 is positioned on region 82. A conductive material region 88 is positioned on region 84 and a conductive material region 86 is positioned on region 88. Here, the bonding surface is between regions 84 and 88. An advantage of this embodiment is that there is metal-to-metal bonding, which may provide less micro-void formation at the bonding interface by using a high temperature metal reflow, as described in U.S. Pat. No. 7,470,598, entitled WAFER BONDING METHOD, which issued on Dec. 30, 2008 to the same inventor, the contents of which are incorporated by reference as though fully set forth herein.

Figure 1E:
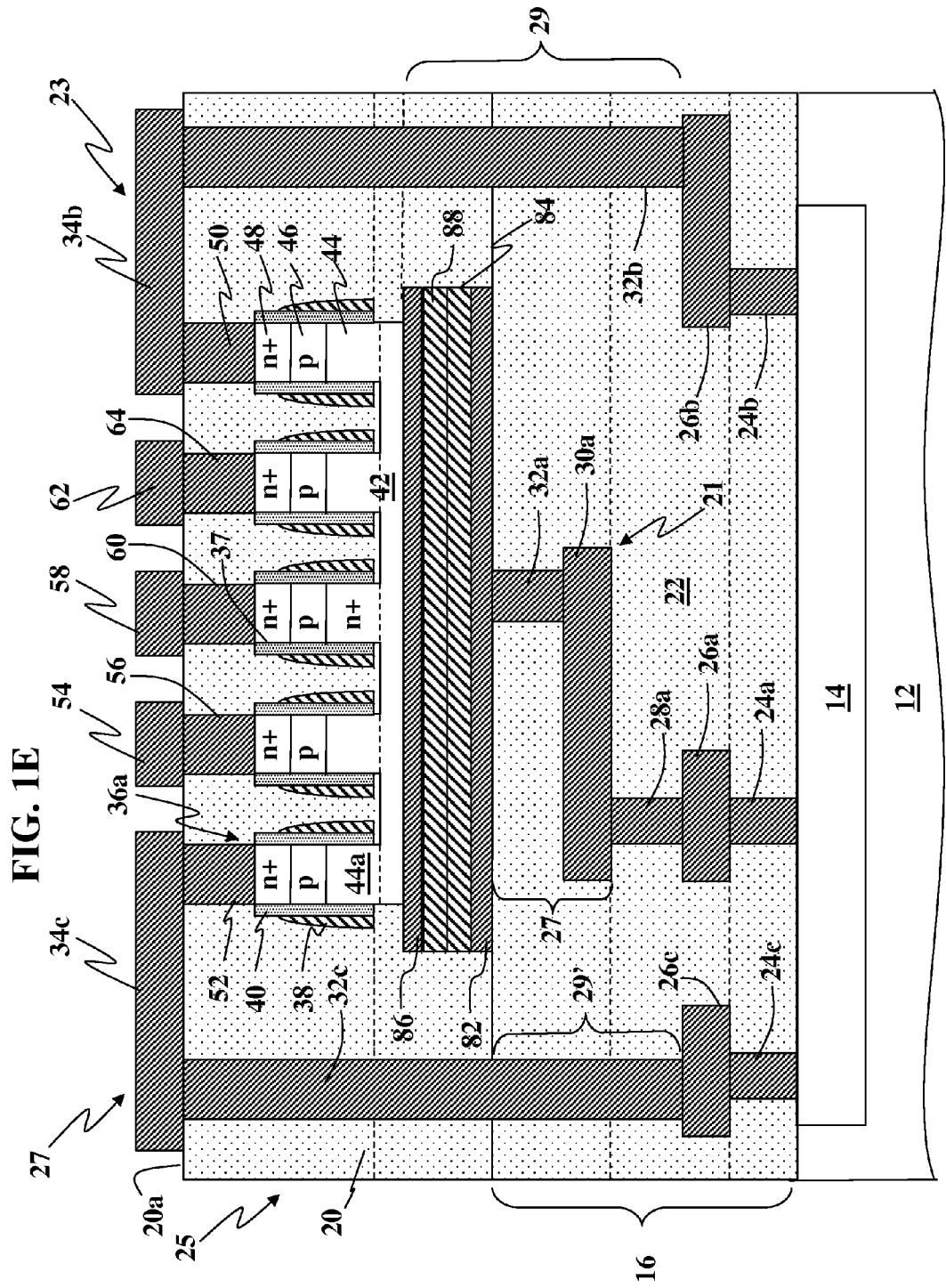

FIG. 1E is a simplified sectional view of a circuit 27 in accordance with the present invention, which is similar to circuit 23 discussed above. In this embodiment, however, circuit 27 includes a conductive region 25. Conductive region 25 includes, in dielectric region 16, a contact 24c coupled on one end to circuit 14 and an interconnect 26c coupled to its other end. A via 32c extends upwardly from interconnect 26c where it is coupled to an interconnect 34c positioned on surface 20a. Interconnect 34c is coupled between via 32c and contact 52 so that conductive region 25 operates as a bit line. In this embodiment, via 32a of conductive region 21 is coupled to conductive material region 82 near surface 22a of dielectric region 22. An advantage of circuit 27 is that all of conductive region 21 is below surface 42a and, consequently, signals can flow faster between base support structure 42 and electronic circuit 14. Another advantage is that it uses less routing space and, as a result, it has higher packing density.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

1. Apparatus, comprising:
a base support structure with a surface and an opposed surface, the base support structure including single crystalline semiconductor material;
a device structure extending from the surface of the base support structure, wherein the device structure includes semiconductor material; and
a first conductive region connected to and extending from the device structure wherein at least a portion of the first conductive region extends below the opposed surface; and
a second conductive region connected to the base support structure, wherein at least a portion of the second conductive region extends below the opposed surface of the base support structure.

2. The apparatus of claim 1, wherein the device structure includes a material stack at least partially surrounded with an insulator region and a control terminal, the insulator region being adjacent to the material stack.

3. The apparatus of claim 2, wherein the conductivity of the material stack is adjustable in response to a signal provided to the control terminal.

4. The apparatus of claim 1, further including an electronic circuit positioned below the opposed surface of the base support structure, the electronic circuit being coupled to the first conductive region.

5. Apparatus, comprising:
a metal bonding region;
a base support structure bonded to a dielectric material region through the metal bonding region;
a device structure extending from a surface of the base support structure;
a first conductive region in communication with the device structure through the base support structure, wherein the first conductive region is connected to the base support structure; and
a second conductive region in communication with the base support structure through the device structure, wherein the second conductive region is connected to the device structure;
wherein the first and second conductive regions extend below the dielectric material region.

6. The apparatus of claim 5, wherein the first and second conductive regions do not extend through the base support structure.

7. The apparatus of claim 5, wherein the first and second conductive regions are in communication with opposed ends of the device structure.

8. The apparatus of claim 5, wherein the second conductive region is not in communication with the device structure through the base support structure.

9. The apparatus of claim 5, wherein the first conductive region is not in communication with the base support structure through the device structure.

10. An apparatus, comprising:
a dielectric material region carried by an interconnect region;
a base support structure bonded to the dielectric material region, wherein the base support structure includes a planarized surface which faces the dielectric material region;
a device structure which extends away from the planarized surface of the base support structure;
a first conductive region connected to the base support structure; and
a second conductive region connected to the device structure;
wherein the first and second conductive regions extend below the planarized surface of the base support structure.

11. The apparatus of claim 10, wherein the first and second conductive regions are in communication with opposed ends of the device structure.

12. The apparatus of claim 10, further including an electronic circuit in communication with the device structure through the first and second conductive regions.

13. The apparatus of claim 10, wherein the first conductive region is in communication with the device structure through the base support structure.

14. Apparatus, comprising:
a base support structure with a surface and an opposed surface, and a sidewall extending between the surface and opposed surface, wherein the base support structure includes semiconductor material;

a device structure extending from the surface of the base support structure, wherein the device structure includes single crystalline semiconductor material;

a first conductive region connected to the surface of the base support structure wherein at least a portion of the first conductive region extends below the opposed surface; and a second conductive region connected to the device structure, wherein at least a portion of the second conductive region extends below the opposed surface.

15. The apparatus of claim 14, further including insulator material between the first conductive region and sidewall of the base support structure.

16. The apparatus of claim 14, further including insulator material between the second conductive region and sidewall of the base support structure.

17. The apparatus of claim 1, further including a dielectric material region bonded to the opposed surface of the base support structure.

18. The apparatus of claim 17, further including an interconnect region which carries the dielectric material region.

19. The apparatus of claim 18, wherein the interconnect region includes at least one conductive interconnect and/or via extending through an insulator material.

20. The apparatus of claim 1, further including a plurality of device structures extending from the surface of the base support structure, wherein the base support structure operates as a common electrical node for the device structures.

21. The apparatus of claim 17, wherein the device structure is formed after the dielectric material region and base support structure are bonded together.

22. The apparatus of claim 5, wherein the dielectric material region is bonded to an opposed surface of the base support structure.

23. The apparatus of claim 22, further including an interconnect region which carries the dielectric material region, the interconnect region including an insulator material and first and second conductive lines extending through the insulator material.

24. The apparatus of claim 23, wherein the first and second conductive lines of the interconnect region are connected to the first and second conductive regions, respectively.

25. The apparatus of claim 5, wherein a first portion of the first conductive region extends below an opposed surface of the base support structure.

26. The apparatus of claim 25, wherein a second portion of the first conductive region extends above the opposed surface of the base support structure.

27. The apparatus of claim 5, wherein a first portion of the second conductive region extends below an opposed surface of the base support structure.

28. The apparatus of claim 27, wherein a second portion of the second conductive region extends above the opposed surface of the base support structure.

29. The apparatus of claim 22, wherein the device structure is formed after the dielectric material region and opposed surface of the base support structure are bonded together.

30. The apparatus of claim 10, wherein the interconnect region includes an insulator material and first and second conductive lines extending through the insulator material.

31. The apparatus of claim 10, wherein the first conductive region extends above and below the planarized surface of the base support structure.

32. The apparatus of claim 10, wherein the second conductive region extends above and below the planarized surface of the base support structure.

33. The apparatus of claim 10, wherein the device structure is formed after the dielectric material region and interconnect region are bonded together.

34. Apparatus, comprising:

a base support structure coupled with an interconnect region through a bonding interface, wherein the base support structure includes single crystalline semiconductor material;

a plurality of device structures extending from a surface of the base support structure, the base support structure operating as a common electrical node for the device structures;

a first conductive region connected to an opposed surface of the base support structure; and a plurality of second conductive regions connected to a corresponding device structure, wherein at least one of the second conductive regions extends through the interconnect region.

35. The apparatus of claim 34, further including the bonding interface, wherein the first conductive region is formed after the bonding interface is formed.

36. The apparatus of claim 34, further including a dielectric material region positioned between the base support structure and interconnect region, wherein the bonding interface is between the dielectric material region and base support structure.

37. Apparatus, comprising:

an interconnect region;

a base support structure which includes single crystalline semiconductor material;

a bonding interface which couples the base support structure and interconnect region together, wherein the bonding interface is proximate to a surface of the base support structure;

a device structure extending from an opposed surface of the base support structure, wherein the device structure is formed after the bonding interface is formed;

a first conductive region connected to the base support structure; and a second conductive region connected to device structure; wherein the first and second conductive regions extend through the interconnect region.

38. The apparatus of claim 37, wherein the device structure includes an insulator region at least partially surrounding a stack of semiconductor layers, the insulator region being formed after the bonding interface is formed.

39. The apparatus of claim 37, wherein the device structure includes a control terminal at least partially surrounding a stack of semiconductor layers, the control terminal being formed after the bonding interface is formed.

40. The apparatus of claim 37, wherein the device structure operates as a vertically oriented semiconductor device.

41. Apparatus, comprising:

a base support structure with a surface and an opposed surface, wherein the base support structure includes single crystalline semiconductor material;

a device structure extending from the surface of the base support structure, wherein the device structure includes semiconductor material; and a first conductive region connected to the device structure, wherein at least a portion of the first conductive region extends below the opposed surface;

a second conductive region connected to the base support structure, wherein at least a portion of the second conductive region extends below the opposed surface.

42. The apparatus of claim 41, wherein the base support structure consists essentially of single crystalline semiconductor material.

43. The apparatus of claim 41, wherein the device structure includes single crystalline semiconductor material.

44. The apparatus of claim 41, wherein the device structure includes a pn junction.

45. The apparatus of claim 44, further including an insulator region and control terminal, wherein the control terminal is spaced from the pn junction by the insulator region.

46. The apparatus of claim 45, wherein the conductivity of the pn junction is adjustable in response to a signal provided to the control terminal.

47. The apparatus of claim 41, wherein the device structure includes a stack of semiconductor material layers.

48. The apparatus of claim 41, wherein the conductivity of the base support structure is n-type.

49. The apparatus of claim 41, further including an interconnect region coupled to the base support structure through a bonding interface.

50. Apparatus, comprising:
a base support structure coupled to a dielectric material region through a bonding interface;
a device structure extending from a surface of the base support structure, wherein the device structure includes single crystalline semiconductor material;
a first conductive region connected to the device structure; and
a second conductive region connected to an opposed surface of the base support structure.

51. The apparatus of claim 50, further including the dielectric material region and bonding interface.

52. The apparatus of claim 50, wherein the base support structure includes semiconductor material.

53. The apparatus of claim 50, wherein the base support structure consists essentially of single crystalline semiconductor material.

54. The apparatus of claim 50, wherein the device structure includes a pn junction.

55. An apparatus, comprising:
an electronic circuit;
an interconnect region in communication with the electronic circuit;
a base support structure coupled to the interconnect region through a bonding interface, wherein the base support structure includes single crystalline semiconductor material and the interconnect region extends between the base support structure and electronic circuit;
a device structure which extends from a surface of the base support structure;
a first conductive region connected to the base support structure; and
a second conductive region connected to with the device structure;
wherein the first and second conductive regions extend between an opposed surface of the base support structure and the electronic circuit.

56. The apparatus of claim 55, wherein the device structure includes adjacent layers of single crystalline semiconductor material.

57. The apparatus of claim 55, wherein the device structure consists essentially of semiconductor material.

58. The apparatus of claim 55, wherein the base support structure consists essentially of semiconductor material.

59. The apparatus of claim 55, wherein the base support structure and device structure consist essentially of single crystalline semiconductor material.

60. Apparatus, comprising:
an electronic circuit and interconnect region connected together;
a base support structure with a surface and an opposed surface, and a sidewall extending between the surface and opposed surface, wherein the base support structure includes single crystalline semiconductor material;
a device structure extending from the surface of the base support structure;
a first conductive region connected to the device structure;
a second conductive region connected to the surface of the base support structure;
wherein the first and second conductive regions extend between the opposed surface and electronic circuit.

61. The apparatus of claim 60, further including insulator material between the first conductive region and sidewall of the base support structure.

62. The apparatus of claim 60, further including insulator material between the second conductive region and sidewall of the base support structure.

63. The apparatus of claim 60, further including a dielectric material region coupled to the opposed surface of the base support structure through a bonding interface.

64. The apparatus of claim 63, wherein the bonding interface is formed in response to coupling the dielectric material region and base support structure together.

65. The apparatus of claim 60, further including a bonding interface between the interconnect region and base support structure.

66. The apparatus of claim 65, wherein the bonding interface is formed in response to coupling the base support structure and interconnect region together.

67. The apparatus of claim 65, wherein the device structure includes a pn junction.

68. The apparatus of claim 67, wherein the pn junction is formed before the bonding interface is formed.

69. The apparatus of claim 65, wherein the semiconductor material of the base support structure is formed before the bonding interface is formed.

70. Apparatus, comprising:
an electronic circuit and interconnect region connected together;
a base support structure coupled with the interconnect region through a bonding interface, wherein the base support structure includes semiconductor material;
a device structure extending from a surface of the base support structure, wherein the device structure includes a stack of single crystalline semiconductor materials;
a first conductive region connected to the device structure; and
a second conductive region connected to an opposed surface of the base support structure:
wherein the first and second conductive regions are connected to the electronic circuit through the interconnect region.

71. The apparatus of claim 70, wherein the bonding interface extends between an opposed surface of the base support structure and the interconnect region.

72. The apparatus of claim 70, further including a dielectric material region which couples the base support structure and interconnect region together, wherein the bonding interface is formed in response to coupling the base support structure and interconnect region together.

73. Apparatus, comprising:
an electronic circuit;
an interconnect region connected to the electronic circuit;

a base support structure which includes single crystalline semiconductor material;

a bonding interface which couples the base support structure and interconnect region together, wherein the bonding interface is proximate to a surface of the base support structure; and a device structure extending from the base support structure, the device structure including a pn junction;

a first conductive region connected to the device structure; and a second conductive region connected to an opposed surface of the base support structure;

wherein the first and second conductive regions are connected to the electronic circuit through the interconnect region.

74. The apparatus of claim 73, wherein the bonding interface is formed in response to coupling the interconnect region and base support structure together.

75. The apparatus of claim 73, wherein the bonding interface is formed in response to moving the base support structure towards the interconnect region.

76. The apparatus of claim 73, wherein the device structure operates as a vertically oriented semiconductor device.

77. The apparatus of claim 1, wherein the device structure includes single crystalline semiconductor material.

78. The apparatus of claim 14, wherein the base support structure includes single crystalline semiconductor material.

79. The apparatus of claim 14, wherein the device structure includes adjacent layers of single crystalline semiconductor material.

80. The apparatus of claim 1, further including an active device which includes the device structure.

81. The apparatus of claim 2, wherein the control terminal is spaced from the material stack by the insulator region.

82. The apparatus of claim 1, wherein the device structure includes a stack of single crystalline semiconductor layers.

83. The apparatus of claim 1, wherein the device structure includes adjacent layers of single crystalline semiconductor material.

84. The apparatus of claim 1, further including an electronic circuit in communication with the device structure through the first conductive region.

85. The apparatus of claim 84, wherein the electronic circuit includes CMOS circuitry.

86. The apparatus of claim 1, wherein the opposed surface of the base support structure is a planarized surface.

87. The apparatus of claim 1, wherein the surface of the base support structure is an etched surface.

88. The apparatus of claim 87, wherein the device structure includes a mesa structure having as sidewall extending from the etched surface.

89. The apparatus of claim 88, wherein the device structure includes an insulator layer and control terminal.

90. The apparatus of claim 89, wherein the insulator region extends annularly around the mesa structure.

91. The apparatus of claim 90, wherein the control terminal extends annularly around the insulator region.

92. The apparatus of claim 90, wherein the control terminal is spaced from the mesa structure by the insulator region.

93. The apparatus of claim 88, wherein the mesa structure includes a portion of the base support structure.

94. The apparatus of claim 1, wherein the base support structure includes a protrusion which extends away from the opposed surface.

95. The apparatus of claim 94, wherein the device structure includes the protrusion.

96. The apparatus of claim 94, wherein the protrusion includes semiconductor material.

97. The apparatus of claim 94, wherein the protrusion includes single crystalline semiconductor material.

98. The apparatus of claim 94, wherein the base support structure includes a plurality of protrusions which extend away from the opposed surface.

99. The apparatus of claim 5, wherein the base support structure includes crystalline semiconductor material.

100. The apparatus of claim 5, wherein the base support structure includes single crystalline semiconductor material.

101. The apparatus of claim 5, wherein the base support structure includes a planarized surface which faces the metal bonding region.

102. The apparatus of claim 10, wherein the base support structure includes crystalline semiconductor material.

103. The apparatus of claim 10, wherein the base support structure includes single crystalline semiconductor material.

104. The apparatus of claim 70, wherein the base support structure includes a planarized surface which faces the interconnect region.

105. The apparatus of claim 70, wherein the surface of the base support structure is an etched surface.

106. The apparatus of claim 70, wherein the surface is an etched surface, and the base support structure includes a planarized surface opposed to the etched surface.

107. The apparatus of claim 70, wherein the base support structure includes single crystalline semiconductor material.

* * * * *